(12) United States Patent
Hansen et al.

(10) Patent No.: US 10,816,431 B1
(45) Date of Patent: Oct. 27, 2020

(54) LEAK DETECTION SYSTEM FOR UNDERGROUND ACCESS CHAMBERS USING CONDUCTIVITY

(71) Applicant: Electro Scan, Inc., Sacramento, CA (US)

(72) Inventors: Charles A. Hansen, Carmichael, CA (US); Mark J. Grabowski, Pewaukee, WI (US); Sean T. Blottie, Fair Oaks, CA (US); Cory T. Peters, Sacramento, CA (US); Sonja M. Hansen, Carmichael, CA (US); Bianca C. Hansen, Carmichael, CA (US); Charles E. G. Johnson, Sacramento, CA (US)

(73) Assignee: Electro Scan, Inc., Sacramento, CA (US)

( * ) Notice: Subject to any disclaimer, the term of this patent is extended or adjusted under 35 U.S.C. 154(b) by 190 days.

(21) Appl. No.: 16/122,599

(22) Filed: Sep. 5, 2018

Related U.S. Application Data

(63) Continuation-in-part of application No. 15/707,890, filed on Sep. 18, 2017, now Pat. No. 10,451,515.

(51) Int. Cl.
*G01M 3/18* (2006.01)
*G01R 19/15* (2006.01)
(Continued)

(52) U.S. Cl.
CPC ............... *G01M 3/18* (2013.01); *G01M 3/40* (2013.01); *G01R 19/15* (2013.01); *G01R 19/2506* (2013.01)

(58) Field of Classification Search
CPC .......... G01M 3/18; G01M 3/40; G01R 19/15; G01R 19/2506
See application file for complete search history.

(56) References Cited

U.S. PATENT DOCUMENTS 6,172,940 B1    1/2001   McConnell
6,301,954 B1   10/2001   Schuberth
(Continued)

OTHER PUBLICATIONS

Electro Scan, Inc.; Next Generation Water Leak Detection and Water Loss Services; Jan. 17, 2016; Brochure.

*Primary Examiner* — Clayton E. LaBalle
*Assistant Examiner* — Michael A Harrison
(74) *Attorney, Agent, or Firm* — Heisler & Associates (57) ABSTRACT

An electrically conductive probe, such as a probe similar to those utilized in other electric leak detection systems, is positioned electrically adjacent to different regions of a wall of an underground access chamber, for detection of leaks therein. In one embodiment, the probe is positioned at an elevation and circumferential position which is sequentially adjusted so that the probe can scan regions of the wall for leaks. In another embodiment, a modified probe remains centrally located within the underground access chamber and only moved vertically. The modified probe is fitted with whiskers extending radially. The modified probe includes sectors circumferentially spaced from each other and with each whisker associated with one of the sectors. A selector switch electrically connects one sector to the electrically conductive cable. Data collected by either probe can be graphed or otherwise analyzed with regions of high conductivity correlating with leaks in the underground access chamber.

10 Claims, 7 Drawing Sheets

(51) Int. Cl.
*G01R 19/25* (2006.01)
*G01M 3/40* (2006.01)

(56) References Cited

U.S. PATENT DOCUMENTS

| | | |
|---|---|---|
| 6,407,562 B1 | 6/2002 | Whiteman |
| 9,304,055 B2 | 4/2016 | Hansen et al. |
| 2013/0218485 A1* | 8/2013 | Hansen ............... G01M 3/40 702/38 |
| 2014/0356229 A1* | 12/2014 | Farren ............... A23L 3/28 422/24 |

* cited by examiner

LEAK DETECTION SYSTEM FOR UNDERGROUND ACCESS CHAMBERS USING CONDUCTIVITY

CROSS-REFERENCE TO RELATED APPLICATIONS

This application is a continuation-in-part of U.S. patent application Ser. No. 15/707,890, filed on Sep. 18, 2017, incorporated herein by reference in its entirety.

FIELD OF THE INVENTION

The following invention relates to systems and methods for detecting leaks and other defects within underground structures. More particularly, this invention relates to such leak detection systems optimized for underground access chambers, such as manholes, and other vertically extending structures with access at an upper end thereof.

BACKGROUND OF THE INVENTION

Sewer systems and other underground pipes and chambers can be difficult to inspect due to their hidden location. Leaks in such pipes can increase costs associated with operating the pipe, and potentially create hazards. Thus, it is beneficial to identify defects in the pipe which can leak (both leaks into and out of the pipe).

One form of defect detection is described in detail in ASTM Standard F2550-06 which describes an electroscan method (also called electric or conductivity leak detection) for defect detection by measuring variations in electric current flow through walls of the pipe as part of a series circuit including a voltage source and an electric current sensor, which collects data as the probe moves through a known position within the pipe.

One such probe beneficial for use in conducting this electroscan is the segmented measuring probe for sewer pipes described in U.S. Pat. No. 6,301,954, incorporated herein by reference in its entirety. Such probes effectively concentrate the electric current over a relatively short length of the pipe in which the probe is located, so that electric current amplitude data gathered by the electroscan method can be accurately correlated with the condition of the pipe directly adjacent the probe.

Operation of the electroscan method can be difficult in that there is a challenge associated with accurately correlating the current amplitude data with the probe position. If the probe is not where the operators think it is when current data is gathered from the current meter, operators will mistakenly associate the current data correlating with pipe defects to the wrong portions of the pipe. Repairs might then be done in the wrong location or further analysis conducted in the wrong location, wasting time, resources and increasing the cost of further analysis and repairs. To precisely correlate probe position with current amplitude data can be a time intensive and laborious process, thus magnifying the resources required to analyze a section of pipe. Accordingly, a need exists for better systems and methods for efficiently gathering and correlating both current amplitude data and probe position data and combining this data into a two-dimensional data array for viewing and meaningful analysis.

Furthermore, raw data gathered from the current meter and probe position often need significant conditioning before it can be most meaningfully evaluated by personnel. Such analysis is beneficially done at a remote location where the most specialized data conditioning software can act on the data, and where the unconditioned and conditioned data can simultaneously be archived and incorporated into a larger data set of overall piping system condition. Data, once conditioned at the remote location, can then be beneficially returned to the site where the operators are located for more precise interpretation of the current amplitude data and correlation to potential pipe defects.

One potential location for leaks is at manholes and other underground access chambers. Prior art electric conductivity leak detection systems do not have any way to scan such access chambers. While access chambers can often be visually inspected, or inspected with cameras, electric/conductivity leak detection systems often detect leaks which other methodologies do not. Accordingly, a need exists for systems and methods for adapting electric/conductivity leak detection systems to manholes and other underground access chambers.

SUMMARY OF THE INVENTION

This invention builds upon prior art electric conductivity leak detection systems and methods. This system includes an electrically conductive probe (such as that described in the background above) coupled to an electrically conductive cable. This electrically conductive cable has an end on an electrically conductive path opposite the probe electrically coupled to a ground interface, in the form of an electrically conductive spike driven into ground in proximity to the underground access chamber. A voltage source and a current meter are interposed along this electrically conductive cable/path. The voltage source produces a potential difference between the ground interface and the probe. The current sensor senses an amount of current flowing through the electrically conductive cable, which, to be able to flow, must have an electrically conductive pathway between the probe and the ground interface, other than through the electrically conductive cable/path. Such current sensed by the current meter is proportional to the conductivity of the path through the soil/ground along this path, and through a wall of the underground access chamber.

The underground access chamber is flooded with liquid, typically up to an elevation at least as high as where evaluation of the underground access chamber is desired. If a leak exists through the wall of the underground access chamber, this leak will be filled with liquid and provide an electrically conductive pathway with greater conductivity than pathways adjacent to portions of the wall without any such leaks. Thus, when the current sensor senses a spike in current, a leak in the wall is likely to be adjacent to the probe.

Underground access chambers are typically cylindrical in form, about a vertically extending centerline. The current sensor logs current measurements while the probe is moved between regions adjacent to the wall of the underground access chamber. Such movement of the probe can be entirely through physical movement of the probe vertically and horizontally, or can be through vertical movement of the probe and selectively switching between regions of the probe which face in different circumferential lateral directions away from the probe. Following either embodiment, the entire wall of the underground access chamber can be scanned for leaks.

In the embodiment where the probe is moved vertically and horizontally, one embodiment of a positioner is disclosed including a boom extending an adjustable length at least partially laterally within the underground access chamber, to come close to the wall of the chamber. This boom preferably extends up out of a rim of the underground access chamber and is mounted upon a collar which rests on the rim, and which collar can rotate relative to the rim. Rotation of the collar relative to the rim causes the probe to move circumferentially to different regions of the wall within the underground access chamber.

The probe is allowed to dangle from the electrically conductive cable, and with electrically conductive cable routed over a tip of the boom, so that the probe is adjacent to the wall of the chamber, and can be raised and lowered to different regions of the wall by gathering or releasing amounts of electrically conductive cable. Through a combination of rotating the boom and raising and lowering the probe through manipulation of the cable, all of the regions of the wall of the underground access chamber can have the probe brought adjacent thereto. By following a standardized movement pattern, the regions of the wall being scanned by the probe can be correlated with electric current sensor data gathered by the probe, so that locations of increased current/conductivity can be correlated with regions of the wall of the underground access chamber, which the probe is adjacent to.

In the embodiment of this invention where the probe has multiple different sectors circumferentially spaced from each other, which can be selectively electrically coupled to the electrically conductive cable, the probe is typically merely raised or lowered down a center of the underground access chamber, along a centerline thereof. Preferably, the probe includes whiskers extending radially from the probe and with tips of the whiskers closer to the walls of the underground access chamber than the probe. Each of the whiskers is coupled to a different sector of the probe. The switch within the probe selects which sector is electrically active and electrically coupled to the electrically conductive cable. The whiskers associated with the active sector then effectively scan portions of the wall of the underground access chamber adjacent thereto. The switch can select different sectors sequentially and the probe can be raised or lowered vertically, until all regions of the wall have been scanned. Physical and electrical switching movements of the probes, in various embodiments can either be manual or at least partially automated and powered.

OBJECTS OF THE INVENTION

Accordingly, a primary object of the present invention is to provide a method for using an electrically conductive probe to scan for leaks or other defects within an underground access chamber.

Another object of the present invention is to provide an electrically conductive probe movable both vertically and horizontally with an underground access chamber to scan the walls of the underground access chamber for leaks.

Another object to the present invention is to provide an underground access chamber leak detection system which utilizes an electrically conductive probe with whiskers extending radially therefrom and which has different sectors circumferentially spaced from each other, which can be selectively activated and deactivated for scanning of different portions of the wall of the underground access chamber, without physical movement of the probe (other than vertically).

Another object of the present invention is to provide a system and method for underground access chamber leak detection which automatically produces data correlating with leaks or other defects within the underground access chamber.

Another object at the present invention is to provide a positioner for positioning of a probe at least vertically while scanning of walls of the underground access chamber for leaks or other defects therein.

Another option to the present invention is to provide a probe suspension and positioning system which can quickly and easily be set up for reliable operation adjacent to an entrance into an underground access chamber to be scanned for leaks.

Other further objects of the present invention will become apparent from a careful reading of the included drawing figures, the claims and detailed description of the invention.

DESCRIPTION OF THE PREFERRED EMBODIMENT

Referring to the drawings, wherein like reference numerals represent like parts throughout the various drawing figures, reference numeral 100 (FIG. 4) is directed to an improvement upon a prior art system 10 (FIGS. 1-3) for identification of pipe defects, described in U.S. Pat. No. 9,304,055, incorporated herein by reference in its entirety. The prior art system 10 (FIG. 1) is consistent with a prior art system described in ASTM (ASTM International, formerly known as "American Society for Testing and Materials") Standard F2550-06 described as "Standard Practice for Locating Leaks in Sewer Pipes Using Electroscan—the Variation of Electric Current Flow Through the Pipe Wall." This prior art system 10 can be utilized in underground pipes such as a sewer S (FIG. 2) by passing a probe 60 through the sewer S pipe, such as between adjacent manholes M to detect defects D in the pipe wall W.

Figure 1:
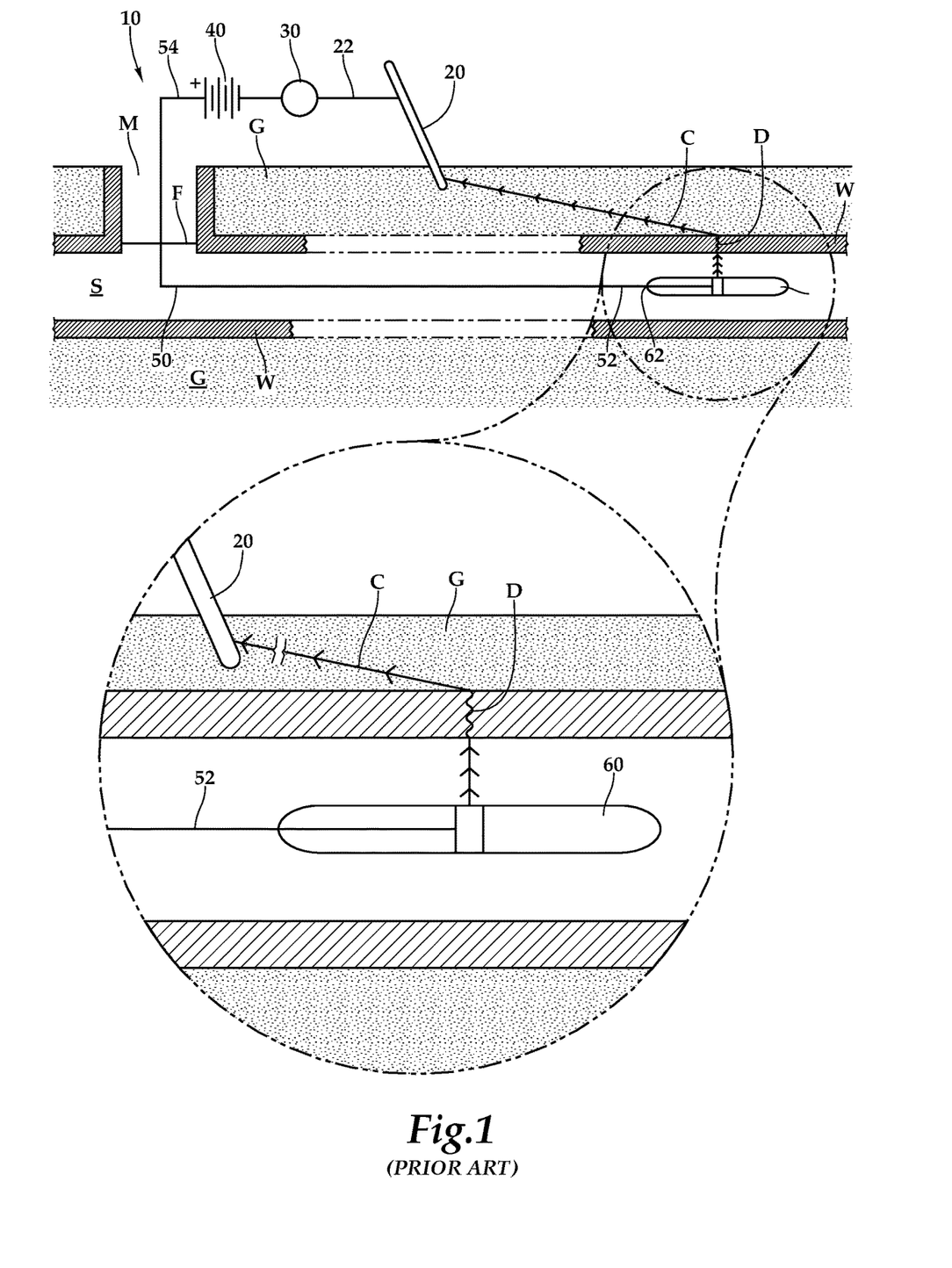
FIG. 1 is an elevation view including a detail depicting schematically one form of prior art electric/conductivity scanning system for underground fluid handling systems.
Figure 2:
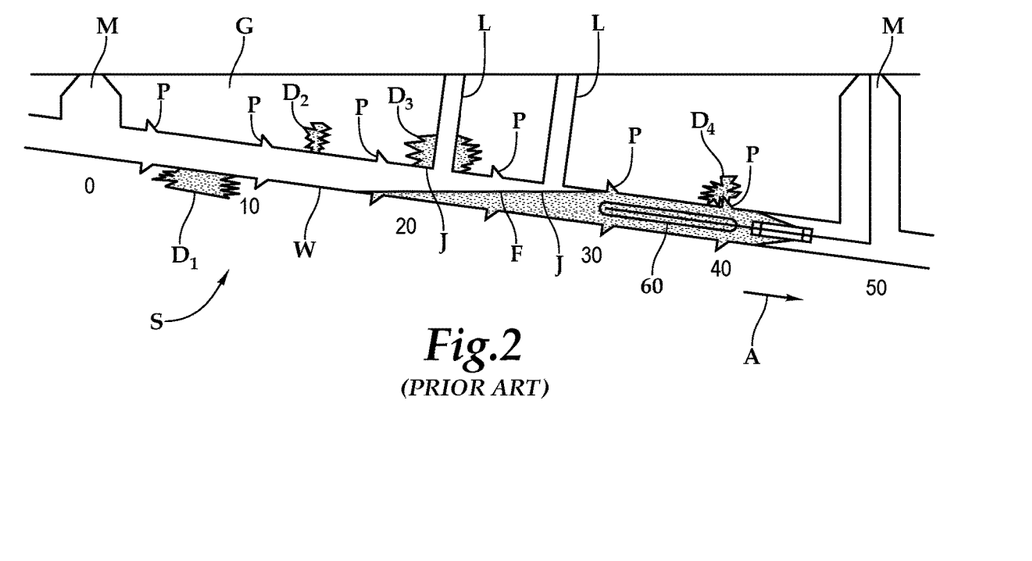
FIG. 2 is an elevation view of an underground fluid line undergoing conductivity leak detection scanning according to a prior art method.
Figure 3:
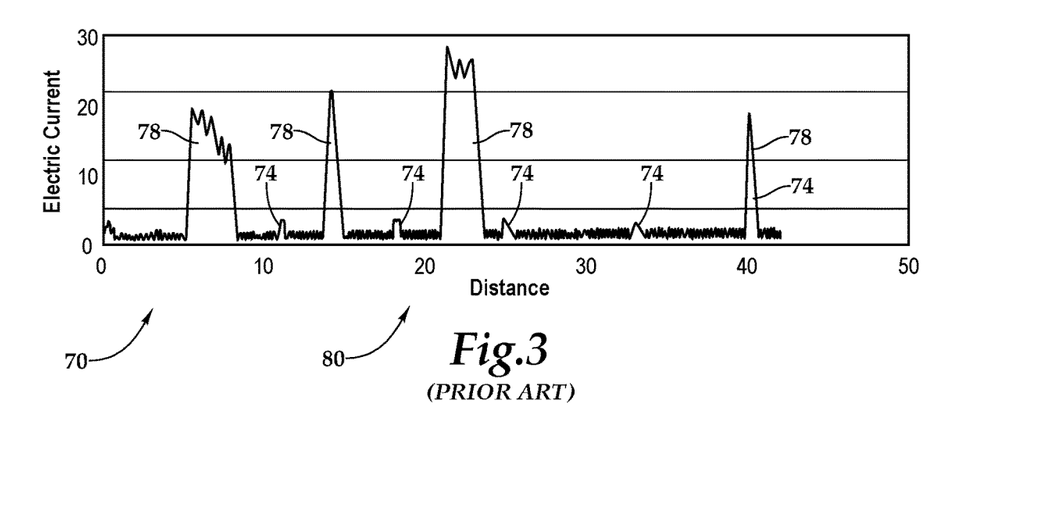
FIG. 3 is a graphic depiction of conductivity measurements obtained in a prior art conductivity leak detection system.

With particular reference to FIGS. 1-3, basic details of the prior art electroscan pipe defect evaluation system are described. This basic electroscan leak detection system 10 causes a series electric circuit to be formed extending along a cable 50 which extends from a probe end 52 to a proximal end 54. The probe end 52 has an electric probe 60 attached thereto, such as through a connector 62. This probe 60 can be similar to or the same as a probe such as that described in U.S. Pat. No. 6,301,954, incorporated herein in its entirety.

The proximal end 54 of the cable 50 is coupled to a ground stake 20 (either directly or through some other electrically conductive path). A voltage source 40 is provided along the cable 50. An electric meter, such as in the form of a current meter, is also located along the cable, or between the voltage source 40 and the ground stake 20, to measure current within this series circuit. Such location of the voltage source and/or the electric meter can involve physical connection or non-physical, such as involving inductance or electromagnetic field forces. A final portion of the series circuit is in the form of a current path C passing from the ground stake 20, through the ground G, and through a defect D in the pipe wall W and through electrically conductive fluid F (typically water with dissolved electrolytes) contained within the pipe and then to the probe 60.

The current meter 30 detects a small amount of current when the pipe wall W is free of defects, because the pipe wall is typically formed of a low or non-electrically conductive material, such as cement pipe, clay pipe, plastic pipe, etc. When there is a defect in the pipe, and because the pipe is filled with electrically conductive fluid F, fluid will pass through this crack or other defect in the flooded pipe and a current pathway is thus provided to enhance an amount of current detected by the current meter 30 or other electric meter. A size and shape of current spike generally correlates with an amount, size and/or shape of this defect.

With reference to FIGS. 2 and 3, examples of different types of defects are indicated by different sizes, shapes and areas under the curve, and amplitudes of electric current spikes 78 in the data plot 72 of current versus probe 60 position. For instance, a longitudinal crack such as defect $D_1$ (FIG. 2) results in a relatively wide current amplitude spike which is spaced away from the location of any laterals or joints between pipe segments. Small and regularly located increases in electric current amplitude are indicative of pipe joint P locations which under normal circumstances might still allow sufficient fluid F to pass therethrough to create a small spike in current.

Point or radial defects such as depicted by $D_2$ (FIG. 2) tend to provide a narrower spike in current amplitude with less area under the curve (FIG. 3). Defects adjacent a lateral L in the sewer S are depicted by defect $D_3$ (FIG. 2) and generally appear in the graphed data as a wide current amplitude spike which is aligned with a location of the lateral. Finally, defects 78 which are aligned with joint locations in the pipe are indicative of a defective joint such as defect $D_4$ (FIG. 2), and correspondingly depicted in FIG. 3.

Figure 4:
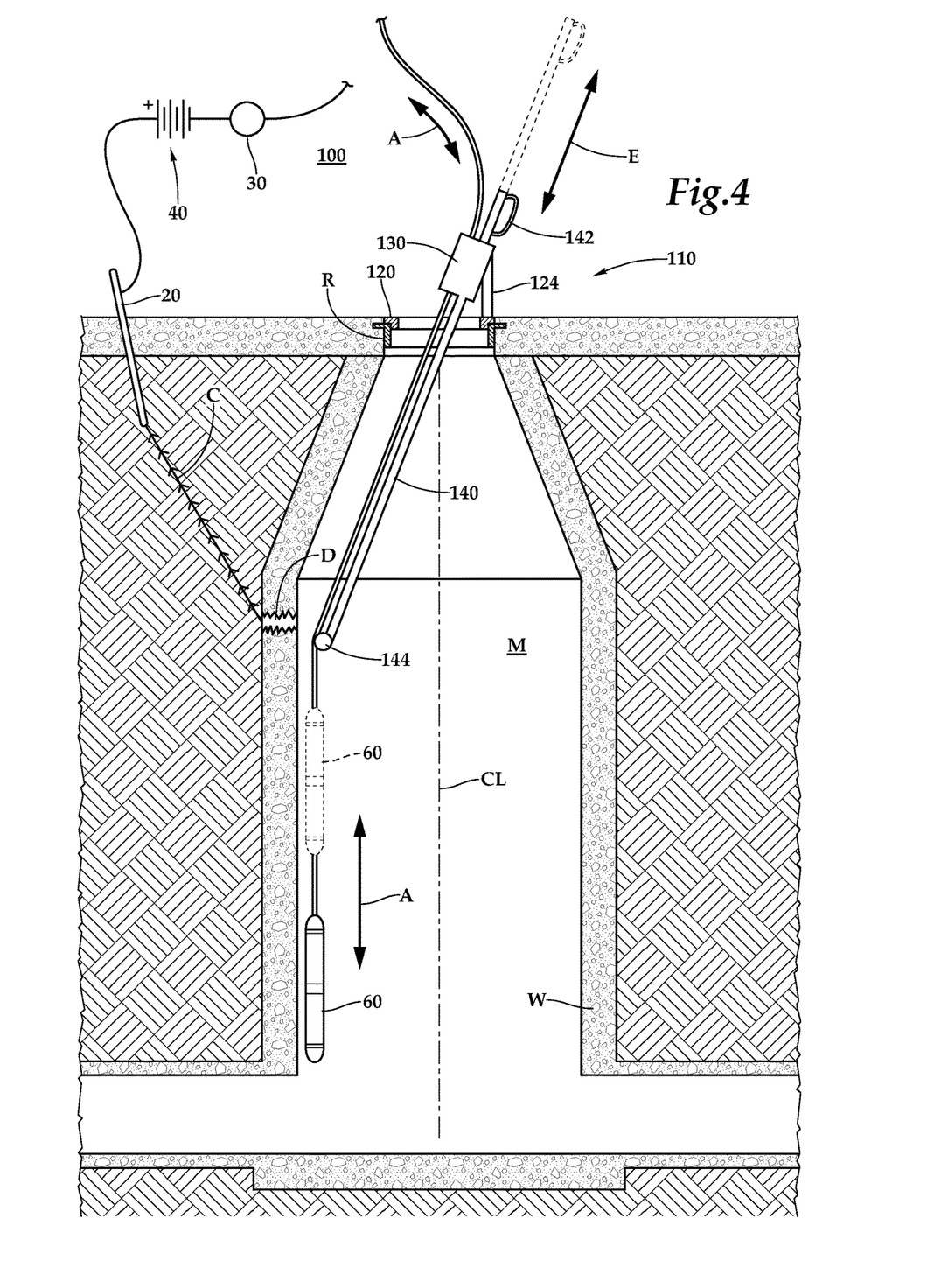
FIG. 4 is a full section elevation view of an underground access chamber with a positioner according to a first embodiment of this invention located therein, for positioning of a probe of the leak detection system both vertically and circumferentially to different regions of the underground access chamber walls, according to one method of this invention.

Generally, the system of the basic electric pipe defective valuation system 10 is adapted for use with manholes or other underground access chambers, and generally referred to as the manhole electric pipe defective valuation system 100. In common with the basic system 10, the manhole system 100 includes a ground interface such as a ground stake 20, a voltage source 40 and a meter 30 such as a current meter (FIG. 4). These elements are all coupled to the electrically conductive cable 50, either directly or through an intervening electrically conductive path. In a first embodiment, depicted in FIGS. 4 and 5, the probe 60 is the same as the probe of the basic system 10 (FIGS. 1-3). Uniquely, an interface assembly 110 is provided which acts as an interface to the manhole M for positioning of the probe 60 where desired.

Figure 5:
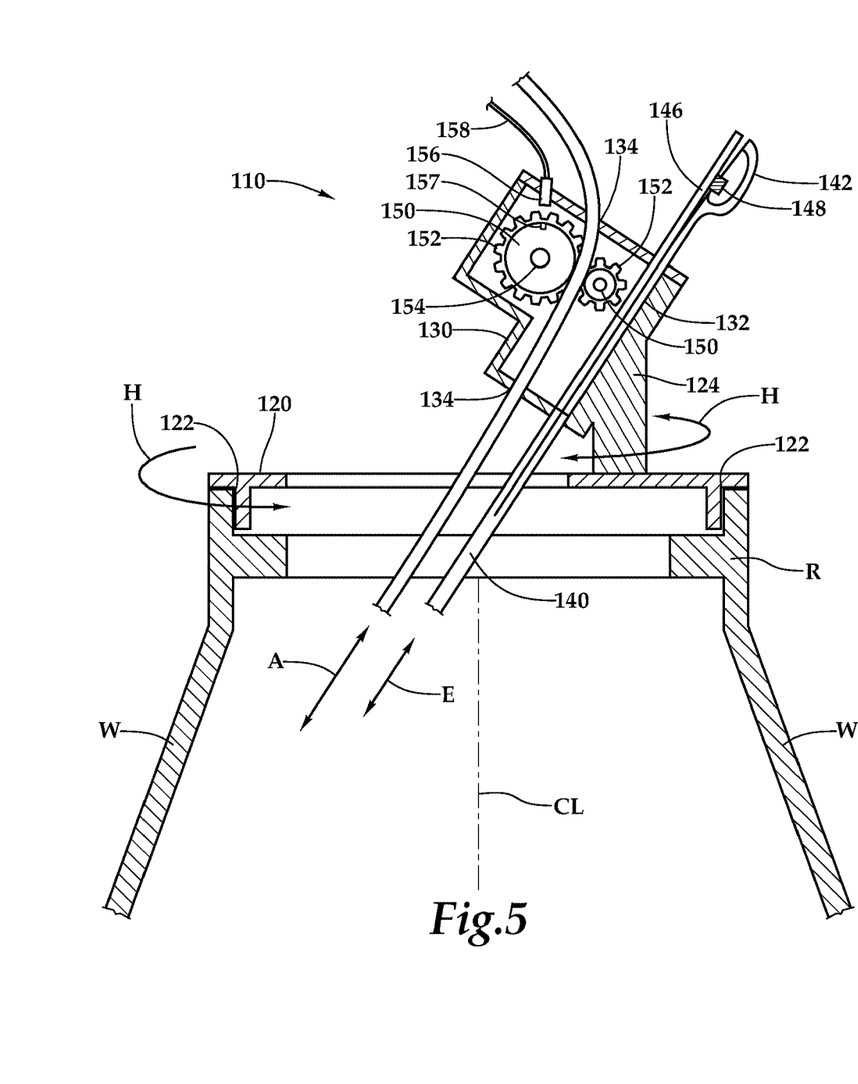
FIG. 5 is a full section detail of a portion of that which is shown in FIG. 4, illustrating how a boom and cable support housing can be configured in one embodiment to provide for positioning of the probe sequentially adjacent to different regions of the wall of the underground access chamber.

The interface assembly 110 includes a collar 120 which is configured to rest within a rim R of an entrance into the manhole M. This collar 120 in the embodiment depicted includes a notch 122 which can rest upon a corner of the rim R of the manhole M, so that the collar 120 nests securely into the rim are of the manhole M. A riser 124 extends up from the collar 120 and has a housing 130 affixed thereto. Thus, the collar 120 is supported upon the rim R, but the collar 120 can rotate (about a centerline CL of the manhole M) along arrow H, while the collar 120 remains upon the rim R. The housing 130 supports a boom 140 extending down into the manhole M, and extending laterally at least somewhat. Rollers 150 are also supported by this housing 130 which hold and position the cable 50 from which the probe 60 is suspended.

The goal of the interface assembly 110, according to this embodiment, is to place the probe 60 adjacent to various different regions of the wall W of the manhole M, so that all of these regions can be scanned for leaks. Because the manhole M is generally cylindrical about the centerline CL, with the centerline being oriented vertically, the interface assembly 110 provides for vertical adjustment of the probe 60 (along arrow A of FIGS. 4 and 5) and for circumferential rotational and lateral horizontal re-positioning of the probe 60 (along arrow H), by rotating of the collar 120 relative to the rim R of the manhole M(about the centerline CL of the manhole M).

It is desirable that the probe 60 be close to the wall W of the manhole M. The manhole M can have various different diameters. To place the probe 60 at such different diameters, the boom 140 is preferably coupled to the housing 130 in an adjustable fashion (along arrow E), so that greater or lesser amounts of the boom 140 can extend both downwardly and laterally horizontally beneath the housing 130. As an option, the housing 130 can be pivoted upon the riser 120 for different angles to be selected as well. By making the boom 140 length adjustable, different diameters of manholes can be accommodated, and the probe 60 can be brought adjacent to the wall W. Then, when the housing 130 is rotated by rotation of the collar 120 relative to the rim R (along arrow H), the probe 60 can be brought adjacent to various portions of the wall W.

In one embodiment, to adjust the length of the boom 140, a tip 144 of the boom 140 is provided opposite a handle 142. A slit 146 divides the boom 140 at the handle 142 into two halves, with a slit 146 therebetween extending at least partially toward the tip 144. A spring 148 is provided between the two halves of the boom 140 on either side of the slit 146, so the boom 140 tends to be splayed out to a greater width. Housing 130 includes a boom path 132 therein which is generally cylindrical with a circular cross-section. The spring 148 (or other biasing element) causes the two halves of the boom 140 adjacent to the handle 142 to be pushed apart and engage this boom path 132 through the housing 130. A friction fit is thus provided, tending to keep the boom 140 positioned at a fixed position relative to the boom path 132 passing through the housing 130.

If the boom 140 needs to be moved so that the tip 144 is closer to the wall W, the handle 142 can be grasped and compressed, the slit 146 narrowed somewhat, and the boom 140 inserted further down on the boom path 132 of the housing 130. Similarly, the boom 140 can be lifted out of the boom path 132 to move the probe 60 away from the wall W if desired. Other forms of boom 140 position adjusters could be alternatively provided.

To accommodate vertical position of the probe 60, different amounts of the cable 50 are routed through the housing 130 and through the rollers 150 therein. These rollers 150 have circular cross-sections spaced apart a distance similar to a diameter of the cable 50, so that the cable 50 fits snugly between the rollers 150. The rollers 150 are preferably geared together with gears 152 so that they turn together. By having some degree of friction therebetween, the rollers 150 can hold the cable 50 static, unless a user pushes on the cable 50 above the housing 130, or pulls on the cable 50 above the housing 130, or similarly works the cable 50 between the housing 130 and the manhole M, to cause movement of the cable 50 through the housing 130, and corresponding movement (along arrow A) of the probe 60 up and down within the manhole M.

If desired, at least one of the rollers 150 can be coupled to a motor 154 so that movement of the cable 50 between the rollers 150 can be automated. A sensor 156 is preferably provided adjacent to at least one of the rollers 150, and with a sensor patch 157 on one of the rollers 150, so that the sensor 156 can be sensitive to a number of turns of the rollers 150, which can then be measured. Senor line 158 can carry this signal to a processor to which the current meter is also connected, so that position of the probe 60 can be correlated with current measurements provided by the sensor 30. Ideally, a sensor can be provided on the collar 120, such as a compass, which can tell which compass direction that the collar 120 and associated housing 130 (as well as the corresponding boom 140) are positioned, so that a circumferential position of the probe 60 with in the manhole M can also be sent and correlated with current data. In this way, current data can be correlated with a compass direction or other coordinate system defining horizontal position within the manhole M.

Typically, the system 100 is initiated and then the probe 60 is moved along a predetermined path passing all of the regions of the wall W sequentially. While the probe 60 is moving, current data is being measured and logged, and correlated with position of the probe 60. In one embodiment, this predetermined path for the probe could be a spiraling path with continuous vertical movement and continuous circumferential movement of the probe 60, such as by providing motors for raising and lowering the probe 60 (along arrow A) and also motors for rotating the collar 120 relative to the rim R (along arrow H of FIG. 5). Typically, motion along arrow E of the boom 140 is merely at the beginning to adjust for a diameter of the manhole M, and is not continuously involved in adjustment.

As an alternative, the probe could scan a vertical section of the wall W of the manhole M, and then the collar 120 could be advanced a circumferential amount, and then a vertical path for the probe 60 could be again followed for this new portion of the wall W. This process is repeated until a full circuit of the collar 120 relative to the rim R has been completed. Similarly, the probe 60 could be set at a fixed elevation, and the collar 120 rotated a full 360°, and then the probe moved to a new elevation for repeating of the rotation of the collar 120 relative to the rim R. Other forms of paths for the probe 60 could similarly be followed in various other embodiments.

Before the system 100 is utilized, the manhole M or other underground access chamber is typically first flooded with electrically conductive liquid. Most typically water and the water which is contained within many underground pipeline systems which are accessed by underground access chambers, is sufficiently conductive to provide the current/conductivity measurements of this system. To flood the manhole M, typically at least one plug (or plug with a controllable bypass valve) is provided in a line at the bottom of the underground access chamber, typically a down slope side. If desired, plugs can be provided on both upstream and downstream portions of such a line accessing the underground access chamber. Water or other liquid is then introduced into the manhole M or other underground access chamber, with the manhole M filled up to a level that is to be scanned. A remainder of the procedures, as described above, are implemented with the probe 60 submerged within this electrically conductive liquid or other fluid.

In the alternative embodiment depicted in the FIGS. 6-9, an alternative interface assembly 210 is provided for use with a probe 60 which is modified according to this invention and as described herein. The alternative interface assembly 210 is simplified in that it merely involves a stand 220 over the rim R of the manhole M, and supporting a pulley 222 thereon, and generally over a centerline CL of the manhole M or other underground access chamber. The pulley 222 preferably includes both a center groove 224 and at least one lateral groove 226 (preferably with two grooves 226) also on the same pulley 222. With the alternative interface assembly 210, the manhole system 100 of this invention is modified with the probe 60 only needing to move vertically along the centerline CL, through movement of the cable 50 over the pulley 222. A pair of guide cables 56 (or at least one guide cable 56) are also a coupled to the probe 60 and routed over the pulley 222, such as utilizing the lateral grooves 226, so that the probe 60 resists rotation about the centerline CL. Other forms of probe 60 rotation could alternatively be provided, such as using a ribbon in place of the cable 50.

With the alternative interface assembly 210, it is important that the probe 60 minimize rotation about the centerline CL. The probe 60 is modified preferably to include whiskers 230 extending radially therefrom out to optional bumpers 235 opposite roots 236. The whiskers 230 can be retrofitted onto the probe 60 by being removably attachable to a clasp 238 mounted to different strategic portions of the probe 60 (e.g. FIG. 9, as well as FIGS. 7 and 8). Tips of the whiskers are adjacent to different portions of the wall W of the manhole M.

In this embodiment system 210, an interior of the probe 60 is modified so that it includes different sectors circumferentially spaced from each other, and with insulation 242 between each of the sectors 240. A central core of the probe 60 is hollowed out, and with a rotating switch 250 therein rotatable (along arrow K of FIG. 8) to provide an electrical connection between different ones of the sectors 240 selectively. The rotating switch 250 is also coupled to the cable 50, so that the rotating switch 250 provides an electrical connection between the cable 50 and only one of the sectors 240, depending on the position of the rotating switch 250.

Figure 8:
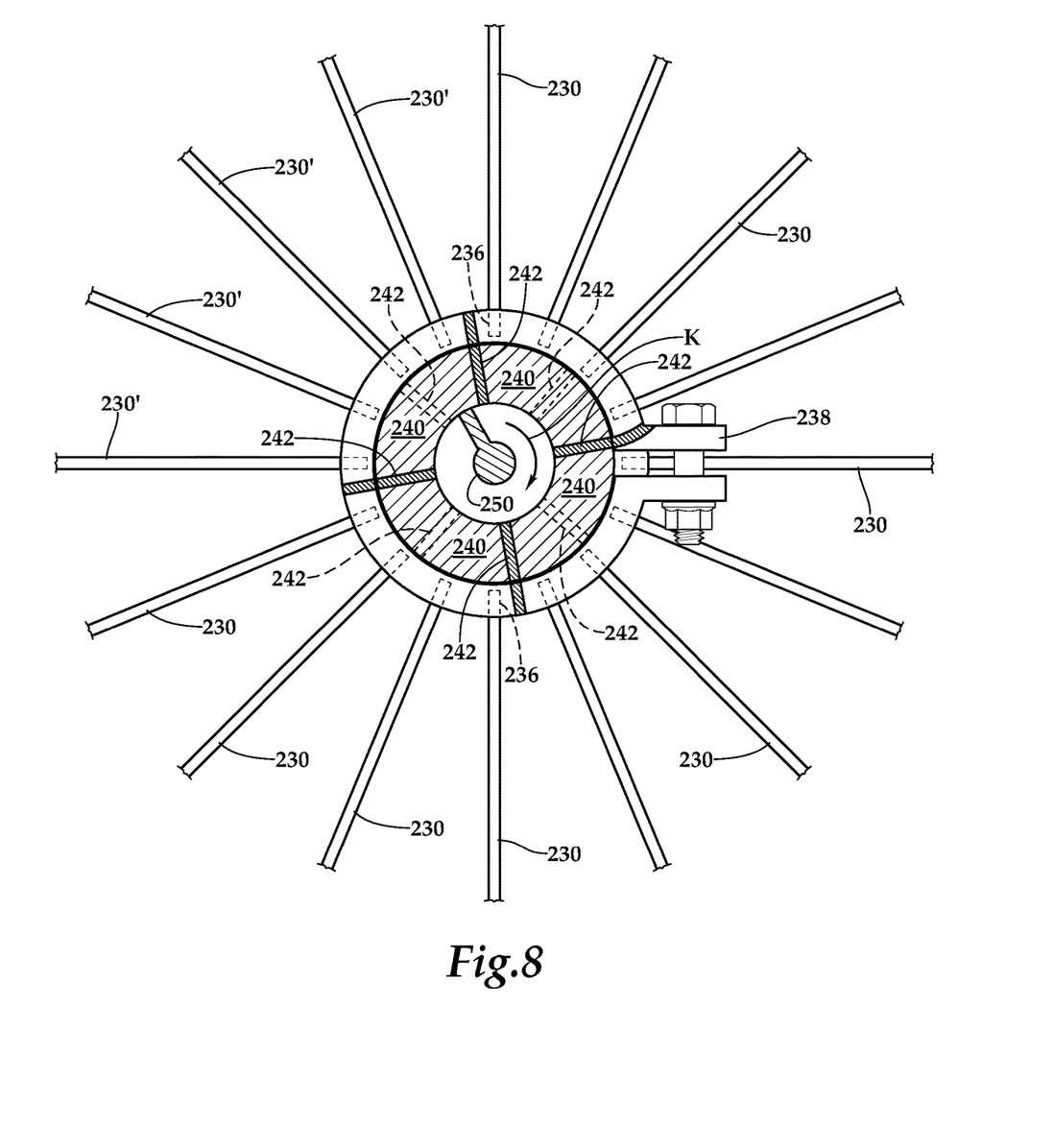
FIG. 8 is a detail of a portion of that which is shown in FIG. 7, revealing how different sectors of the probe are switched to become sequentially electrically active, along with whiskers associated therewith, for scanning of regions of the wall of the underground access chamber.

Insulation 242 between the sectors 240 keeps the sectors 240 isolated from each other electrically.

Whiskers 230 are each associated with one of the sectors 240 alone. With this embodiment of the invention, the probe 60 can remain still, and the rotating switch 250 can be rotated (along arrow K) to cause different sectors 240 to be electrically active and for different tips of the whiskers 230 to be electrically active and to sense regions of the wall W adjacent to the whiskers 230 that are associated with the electrically active sector 240.

With particular reference to FIG. 8, an embodiment is shown where four different sectors are provided, so that separate quadrants of the manhole M would be simultaneously sensed by whiskers associated with an electrically active one of the four sectors 240. In alternative embodiments, different numbers of sectors could be provided. Some insulation 242 is shown in broken lines, illustrating how each of the sectors 240 could be divided in half, so that two whiskers 230 would be associated with each sector, rather than four whiskers 230 associated with each sector. This would allow for eight different circumferentially spaced regions on the walls W at each elevation level to be separately sensed. It is conceivable that an even greater number of insulation 242 barriers 242 could be provided, such as for instance to cause only one circumferentially spaced whisker 230 to be electrically active at any given time.

Figure 6:
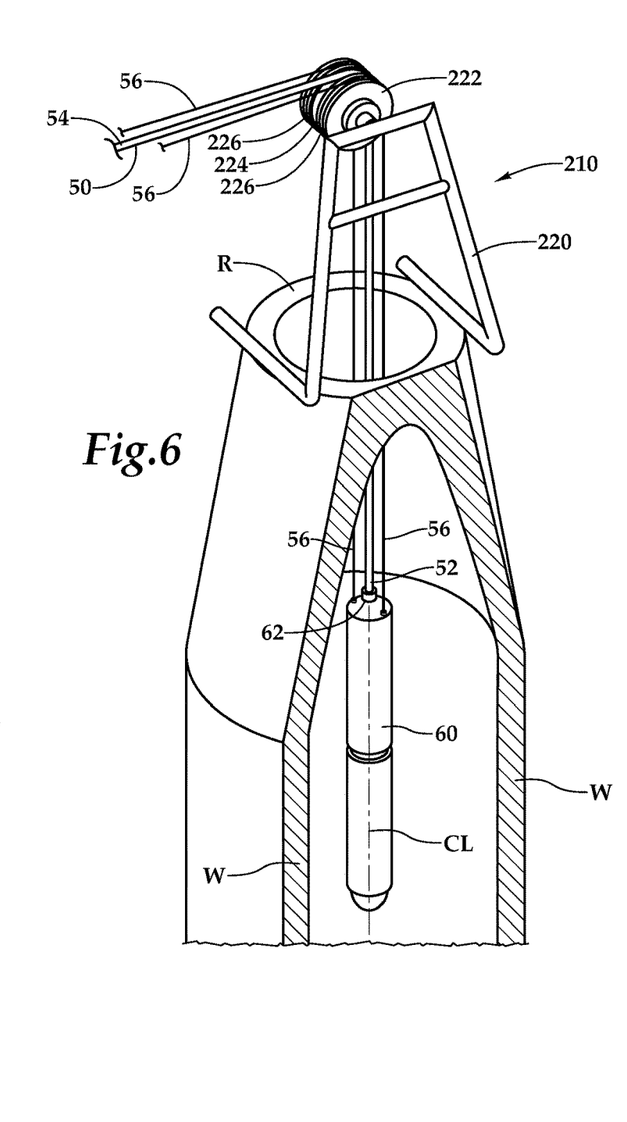
FIG. 6 is a perspective view of an underground access chamber with a portion of a wall cut away therefrom, and depicting an alternative embodiment interface assembly for only providing vertical position adjustment of a probe, and with the probe selectively activating different sectors thereof which are circumferentially spaced to each other, for scanning of walls of the underground access chamber for leaks.
Figure 7:
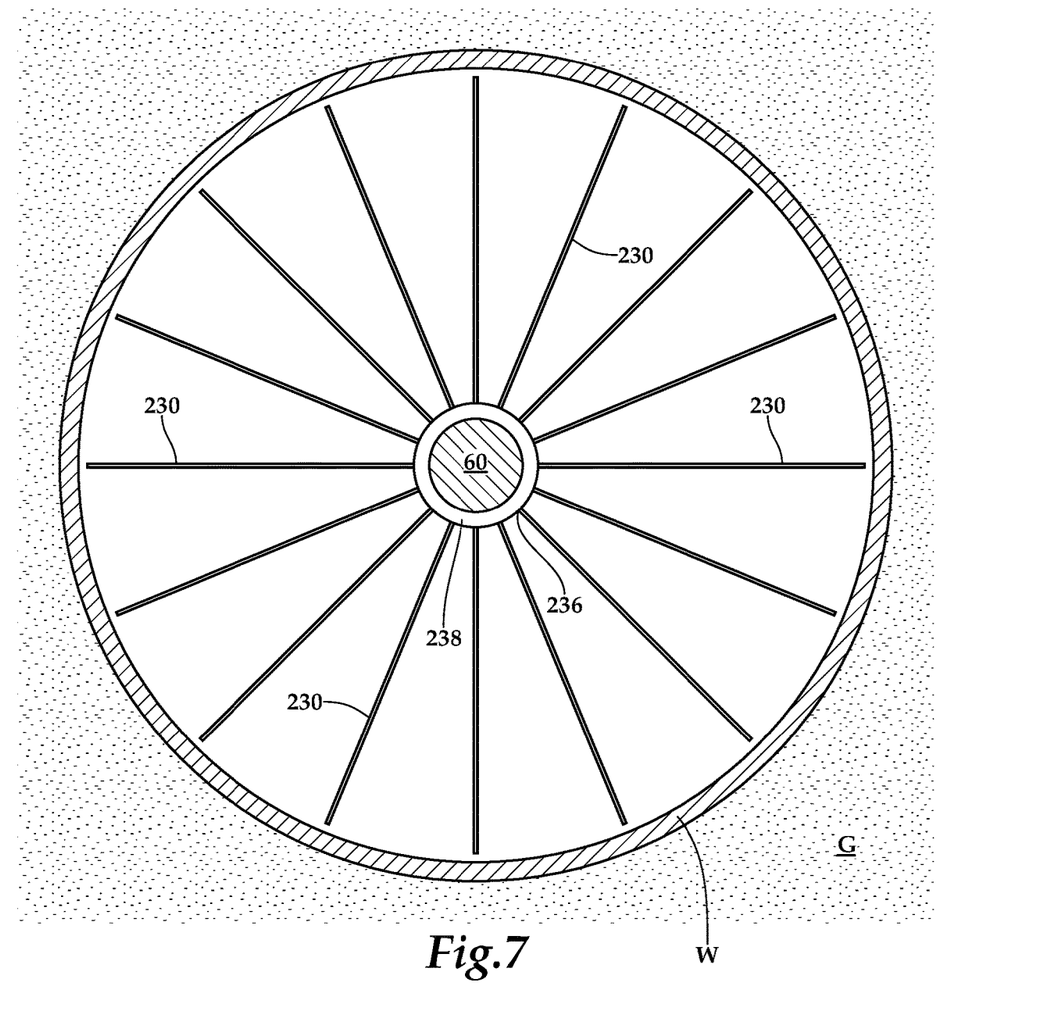
FIG. 7 is a full sectional top plan view of the probe of FIG. 6, and further showing whiskers extending radially therefrom.

With the alternative interface assembly 210, the probe 60 is merely moved vertically to different elevations within the manhole M. The rotating switch 250 is then rotated (along arrow K) and the wall W regions are scanned sequentially, with the scanning correlated with current sensor readings so that leaks or other wall defects can be located. Typically, the probe 60 is placed to the first elevation level and then the rotating switch 250 is sequentially switched and that elevation of the manhole M has the wall W fully scanned. The probe 60 is then moved to a new elevation and the scan is repeated. A sensor on the pulley or elsewhere can identify the elevation of the pulley and this information can be correlated with data collected by the current sensor 30. If desired, the switch 250 can encode position information for the rotating switch within a signal sent along the cable 50, to assist in correlating conductivity measurements with wall W regions.

The whiskers 230 are removably attachable to the probe 60, such as through a clasp 238. Clasps 238 and whiskers 230 having different lengths/radiuses can be provided, so that the tips of the whiskers 230 tend to be brought close to the walls W of the manhole M of differing diameters or other shapes and sizes. The whiskers 230 are preferably electrically conductive and formed of material which is flexible and resilient, such as spring steel, so that the whiskers 230 can flex while the probe 60 is placed into the manhole M, and then spring out to a radially extending form such as that depicted in FIG. 9. As an alternative, the whiskers 230 could be attached to the probe 60 after it is located within the manhole M.

Figure 9:
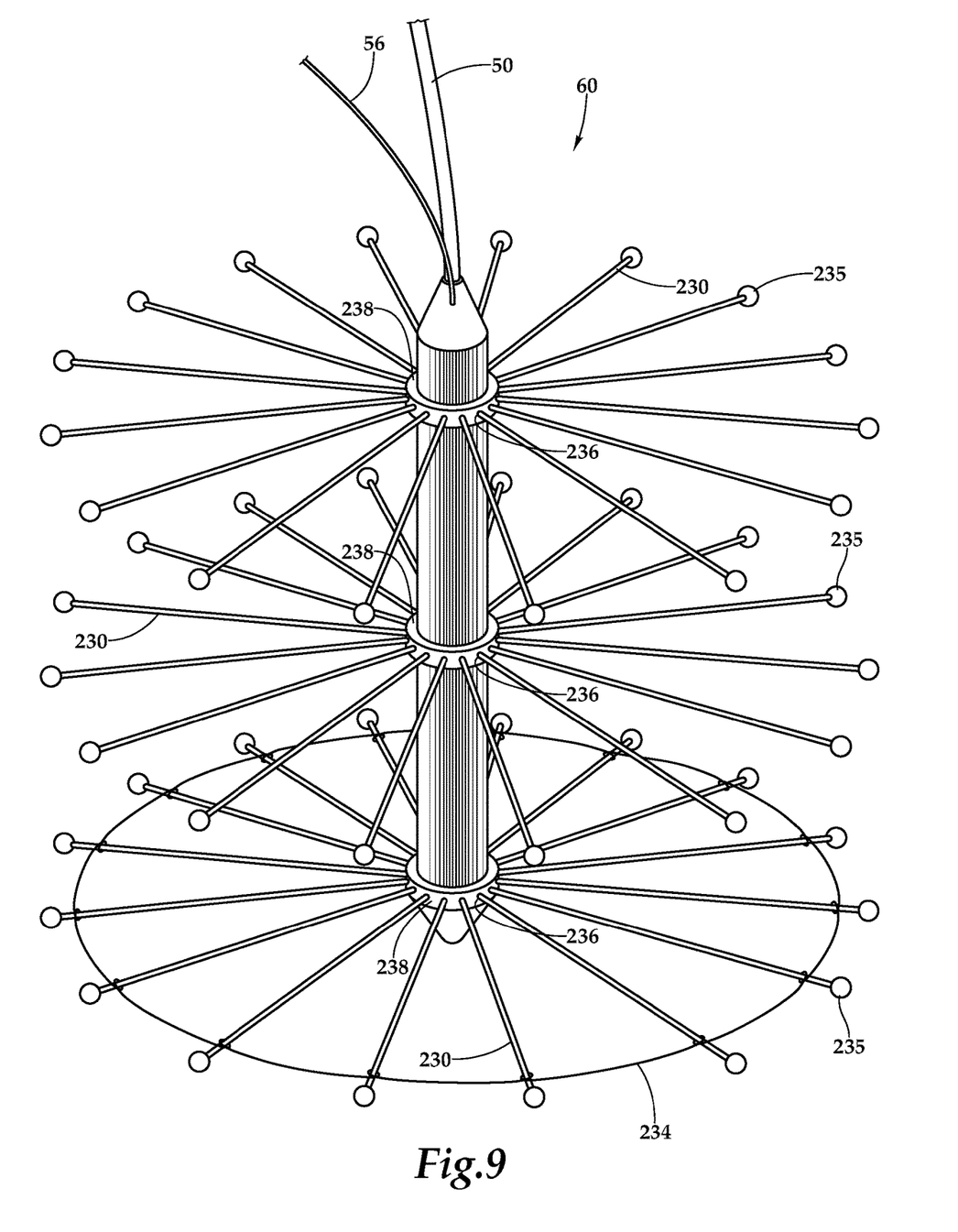
FIG. 9 is a perspective view of the probe of FIGS. 6-8, and further including bumpers and tethers adjacent to tips of the whiskers, and with multiple sets of whiskers extending from different portions of one form of probe for use in one embodiment of this invention.

The bumpers 235 and tethers 234 tend to keep the whiskers 230 in position where desired, rather than potentially bent to an incorrect position where they might provide an inaccurate correlation of current sensed with wall region being sensed. Other forms of struts could be provided to keep the whiskers 230 positioned where desired. The bumpers 235 can be electrically conductive or electrically nonconductive, with the selection made to optimize results being obtained, and such as to improve signal to noise ratio and other attributes of the current signal being sensed to by the system 100.

This disclosure is provided to reveal a preferred embodiment of the invention and a best mode for practicing the invention. Having thus described the invention in this way, it should be apparent that various different modifications can be made to the preferred embodiment without departing from the scope and spirit of this invention disclosure. When embodiments are referred to as "exemplary" or "preferred" this term is meant to indicate one example of the invention, and does not exclude other possible embodiments. When structures are identified as a means to perform a function, the identification is intended to include all structures which can perform the function specified. When structures of this invention are identified as being coupled together, such language should be interpreted broadly to include the structures being coupled directly together or coupled together through intervening structures. Such coupling could be permanent or temporary and either in a rigid fashion or in a fashion which allows pivoting, sliding or other relative motion while still providing some form of attachment, unless specifically restricted.

What is claimed is:

1. A method for detecting leaks in underground access chambers, the method including the steps of:
    filling the underground access chamber at least partially with an electrically conductive fluid;
    placing an electrically conductive probe within the underground access chamber, the probe having an electrically conductive cable extending therefrom, with the cable coupled to a ground interface through a voltage source and a current meter;
    adjusting the probe to be electrically close sequentially to different regions of a wall of the underground access chamber;
    gathering output from said current sensor during said adjusting steps;
    correlating sensor output with the regions of the wall electrically close to the probe, and with higher than average current corresponding with a greater than average likelihood of a leak in the wall of the underground access chamber;
    wherein said adjusting step includes moving the probe vertically within the underground access chamber;
    wherein said adjusting step includes laterally moving the probe at least electrically within the underground access chamber;
    wherein said placing step includes the probe having sectors circumferentially spaced from each other; and
    wherein said adjusting step includes switching between sectors to select which sector is electrically coupled to the ground interface, the selected sector being electrically close to the region of the wall closest to the selected sector.

2. The method of claim 1 wherein said placing step includes placing the probe centrally adjacent to a vertical centerline of the underground access chamber, with the probe having whiskers extending at least partially laterally and radially from the probe, such that tips of the whiskers are closer to the wall of the underground access chamber than the probe, each of the whiskers associated with one of the sectors of the probe.

3. The method of claim 1 wherein at least one guide cable is coupled to the probe and extending substantially parallel with the electrically conductive cable, the guide cable and electrically conductive cable together resisting rotation of the probe about a centerline of the probe and a centerline of the underground access chamber.

4. The method of claim 3 wherein said electrically conductive cable and said at least one guide cable are routed over a common pulley rotatably supported on a stand adjacent to an entrance into the underground access chamber.

5. A method for detecting leaks in underground access chambers, the method including the steps of:
   filling the underground access chamber at least partially with an electrically conductive fluid;
   placing an electrically conductive probe within the underground access chamber, the probe having an electrically conductive cable extending therefrom, with the cable coupled to a ground interface through a voltage source and a current meter;
   adjusting the probe to be electrically close sequentially to different regions of a wall of the underground access chamber;
   gathering output from said current sensor during said adjusting steps;
   correlating sensor output with the regions of the wall electrically close to the probe, and with higher than average current corresponding with a greater than average likelihood of a leak in the wall of the underground access chamber;
   wherein said adjusting step includes moving the probe vertically within the underground access chamber;
   wherein said adjusting step includes laterally moving the probe at least electrically within the underground access chamber;
   wherein said adjusting step includes moving the probe physically to different horizontally spaced portions of the wall of the underground access chamber; and
   wherein a boom extends at least partially laterally within an upper portion of the underground access chamber, with the electrically conductive cable routed over a tip of the boom spaced radially from a centerline of the underground access chamber, the probe suspended by the electrically conductive cable below the tip of the boom.

6. The method of claim 5 wherein said adjusting step includes rotating the boom to cause the tip of the boom to move circumferentially within the underground access chamber to be sequentially brought into close proximity with the different regions of the wall of the underground access chamber.

7. The method of claim 6 wherein the underground access chamber has an upper portion defined by a rim, and with the boom supported upon a collar nesting within said rim and rotatable relative to the rim about the centerline of the underground access chamber.

8. The method of claim 6 wherein said adjusting step includes adjusting a length of the boom so that the tip of the boom moves at least partially radially relative to the centerline of the underground access chamber, such that a diameter of the underground access chamber can be somewhat matched by the boom, for positioning of the probe adjacent to different regions of the wall of the underground access chamber.

9. An underground access chamber leak detection system, the leak detection system comprising combination:
   an electrically conductive probe;
   an electrically conductive cable extending from said probe;
   a ground interface spaced from said probe and embedded within ground into which the underground access chamber is located, said electrically conductive cable defining at least a portion of an electrically conductive path extending from said probe to said ground interface;
   a voltage source interposed along said electrically conductive path;
   a current meter interposed along said electrically conductive path, in series with said voltage source and between said ground interface and said probe; and
   said probe including sectors circumferentially spaced from each other, and including a switch which causes different sectors of said probe to be selectively electrically coupled to said ground interface through said electrically conductive cable.

10. The leak detection system of claim 9 wherein said probe includes whiskers extending radially from said probe to tips which are closer to the wall of the underground access chamber than said probe, each of said whiskers coupled to one of said sectors of said probe.

* * * * *